United States Patent
Sadayuki et al.

(10) Patent No.: US 7,890,283 B2
(45) Date of Patent: Feb. 15, 2011

(54) MALFUNCTION DETECTION SYSTEM AND INTEGRATED CIRCUIT

(75) Inventors: Eiichi Sadayuki, Osaka (JP); Tatsumi Sumi, Osaka (JP)

(73) Assignee: Panasonic Corporation, Osaka (JP)

( * ) Notice: Subject to any disclaimer, the term of this patent is extended or adjusted under 35 U.S.C. 154(b) by 145 days.

(21) Appl. No.: 12/275,509

(22) Filed: Nov. 21, 2008

(65) Prior Publication Data

US 2009/0164162 A1 Jun. 25, 2009

(30) Foreign Application Priority Data

Dec. 25, 2007 (JP) .............................. 2007-333003

(51) Int. Cl.
*G01C 25/00* (2006.01)
*G01R 31/00* (2006.01)
(52) U.S. Cl. ...................... 702/116; 702/58; 324/500; 324/522
(58) Field of Classification Search ................... 702/58, 702/116; 324/500, 522
See application file for complete search history.

(56) References Cited

U.S. PATENT DOCUMENTS 4,425,891 A 1/1984 Kashimura et al.
6,628,123 B2 9/2003 Raffalt et al.
2004/0193988 A1* 9/2004 Saloio ......................... 714/742
2005/0146290 A1* 7/2005 Gray ........................... 315/307

FOREIGN PATENT DOCUMENTS

JP 2004-294442 A 10/2004

OTHER PUBLICATIONS

English language Abstract and translation JP 2004-294442 A.

* cited by examiner

*Primary Examiner*—Bryan Bui
(74) *Attorney, Agent, or Firm*—Greenblum & Bernstein P.L.C.

(57) ABSTRACT

The present invention is applicable to various sensor outputs including pulse signals and reduces cost for detecting malfunction. The malfunction detection system detects a malfunction in a sensor, and the malfunction detection system includes a sensor including a first terminal, and which outputs a sensor output current that varies a voltage level of the first terminal, a current output unit which varies the voltage level of the first terminal by outputting a constant current for judging to the sensor via the first terminal, and a judging unit which judges that the sensor is malfunctioning when the current for judging causes the voltage level of the first terminal to be equal to or higher than a threshold in a period different from a first period where the sensor output current causes the voltage level of the first terminal to be equal to or higher than the threshold.

14 Claims, 13 Drawing Sheets

MALFUNCTION DETECTION SYSTEM AND INTEGRATED CIRCUIT

The present patent application claims priority to Japanese Application No. 2007-333003, filed Dec. 25, 2007, the entire contents of which are expressly incorporated herein by reference in its entirety.

BACKGROUND OF THE INVENTION (1) Field of the Invention

The present invention relates to systems for judging a malfunction in a sensor, and more particularly to a system and an integrated circuit for judging a malfunction in a sensor used for flow counter such as a water meter.

(2) Description of the Related Art

Generally, a water meter having a sensor for measuring the amount of water used is included in a water pipe. For example, the water meter in each household measures the amount of water used in the household, and water rate according to the measured amount of water is charged to the household.

Thus, it is necessary to measure accurate amount of water in order to charge accurate water rate to the household. When there is a malfunction in the sensor of the water meter, which makes the sensor unable to measure the precise amount of water, it is necessary to detect the malfunction and the manager of the water service needs to be notified immediately.

The technique disclosed in the Japanese Unexamined Patent Application Publication No. 2004-294442 has been proposed for detecting such a sensor malfunction.

FIG. 13 is a block diagram of the malfunction detection system disclosed in the Japanese Unexamined Patent Application Publication No. 2004-294442. The malfunction detection system in FIG. 13 detects malfunctions in the sensor for detecting the speed of engine, and includes a sensor 60, an interface 61, a malfunction detection circuit 62, and an OR circuit 63. The interface 61 includes a differential amplifier 611 and a speed input comparator 612. The malfunction detection circuit 62 includes a current source 621, a filtering circuit 622, and a malfunction comparator 623. The sensor 60 is connected to the interface 61 and the malfunction detection circuit 62 via two lead wires 64.

In the conventional malfunction detection system, bias current is outputted to the sensor 60 from the current source 621 via the lead wires 64. The current source 621 is driven and maintained by offset voltage. The offset voltage varies as necessary so that the bias current can be maintained at a predetermined level. The malfunction comparator 623 detects malfunction by monitoring the offset voltage.

When the sensor 60 is experiencing a malfunction (when the sensor is open or short circuited), the offset voltage increases in order to maintain the bias current at a constant level. Here, the malfunction detection circuit 62 generates a malfunction signal when the offset voltage exceeds a predetermined threshold, assuming that the sensor 60 is malfunctioning.

Note that in the configuration in FIG. 13, there is a possibility that the offset voltage varies depending on the output from the sensor 60 (alternating current signal). In response to this, the filtering circuit 622 is provided to eliminate the output component of the sensor 60. The filtering circuit 622 is a low-pass filter including a resistor and a capacitor.

SUMMARY OF THE INVENTION

However, the following describes the problems with the conventional malfunction detection system.

The malfunction detection system described in Japanese Unexamined Patent Application Publication No. 2004-294442 is configured assuming that alternating current signal is sensor output. For this reason, there is a problem that the system is not applicable to a case where the sensor output is pulse signals. This is because of large low-frequency component in the pulse signal, which makes it difficult to fully eliminate noise (output component of the sensor) by a filtering circuit.

In addition, the filtering circuit includes a resistor (resistance value R) and a capacitor (capacitance C). Thus, designing the filtering circuit is difficult due to variation upon manufacturing and variation caused by difference in temperature. Furthermore, RC increases when the cycle of the output signal from the sensor is long or the pulse width of the output signal from the sensor is wide, and the circuit dimension becomes larger. Consequently, there is a problem that the application of the conventional system is costly.

In order to solve the problems, it is an object of the present invention to provide a malfunction detection system which is applicable to various sensor outputs including pulse signals, and is capable of reducing cost.

In order to solve the problems, the present invention is a malfunction detection system which detects a malfunction in a sensor, the malfunction detection system including: a sensor including a first terminal, and which outputs a sensor output current that varies a voltage level of the first terminal; a current output unit which varies the voltage level of the first terminal by outputting a constant current for judging to the sensor via the first terminal; and a judging unit which judges that the sensor is malfunctioning when the current for judging causes the voltage level of the first terminal to be equal to or higher than a threshold in a period different from a first period where the sensor output current causes the voltage level of the first terminal to be equal to or higher than the threshold.

This allows an application to various sensor outputs including pulse signals and cost reduction.

Furthermore, the malfunction detection system further includes a period control unit which sets a second period and a third period in such a manner that either one of the second period and the third period is different from the first period, in which the current output unit is which outputs the current for judging to the sensor via the first terminal in the second period and the third period that are set by the period control unit, and the judging unit judges that the sensor is malfunctioning when the voltage level of the first terminal is equal to or higher than the threshold in both of the second period and the third period.

With this, it is possible to judge the malfunction in the sensor even when the sensor output current and the current for judging are outputted in the same period. Furthermore, the consumption current can be reduced since it is not necessary to output the current for judging all the time.

In addition, the sensor outputs the sensor output current which causes the voltage level of the first terminal to be equal to or higher than the threshold in the first period, and from the end point of a fourth period which is longer than the first period and starting from the starting point of the first period, and the period control unit sets a checking period for checking for the malfunction of the sensor, the checking period including the second period and the third period and being set in such a manner that a period between the starting point of the second period and the starting point of the third period is longer than the first period, and a period between the starting point of the second period and the end point of the third period is shorter than the fourth period. Alternatively, the sensor outputs the sensor output current which causes the voltage level of the first terminal to be equal to or higher than the threshold in the first period and to be an alternating current signal having a predetermined cycle, and the period control unit sets a checking period for checking for the malfunction of the sensor, the checking period including the second period and the third period and being set in such a manner that a period between the starting point of the second period and the starting point of the third period is longer than the first period, and a period between the starting point of the second period and the end point of the third period is shorter than the cycle.

With this, it is possible to judge malfunction in the sensor by controlling the period for outputting the current for judging even when the sensor output is an intermittent pulse signal or an alternating current signal.

Furthermore, the period control unit sets a checking period including N periods having the second period and the third period, where N is an integer equal to or more than 2, the current output unit outputs the current for judging to the sensor via the first terminal during the N periods that are set by the period control unit, and the judging unit judges that the sensor is malfunctioning when the voltage level of the first terminal is equal to or higher than the threshold for m times during the n periods that are set by the period control unit, where $2 \leq M \leq N$ and M is an integer.

With this, the number of malfunction judgment can be increased, and thus the accuracy of malfunction judgment can be improved.

In addition, the judging unit judges that the sensor is malfunctioning when the voltage level of the first terminal is equal to of higher than the threshold in all periods included in the checking period set by the period control unit.

This allows setting the standard for malfunction detection more strictly, and thus the sensor malfunction can be accurately judged.

In addition, the judging unit detects property of the sensor and to determine the value of m according to the detected property.

With this, the standard for malfunction judgment according to the property of the sensor can be set, and thus the accuracy of the malfunction judgment can be improved.

In addition, the sensor further includes a second terminal, the current output unit includes: a first current source connected to the first terminal; and a second current source connected to the second terminal, and the current output unit outputs the current for judging to the sensor from the first current source via the first terminal and to flow the current inputted to the sensor to the second current source via the second terminal.

With this, the stability of the current for judging can be enhanced, and thus the accuracy of the malfunction judgment can be improved.

In addition, the malfunction detection system, further includes an internal power source generating unit which generates a power source supplied to the current output unit, using the sensor output current.

This allows covering electric power necessary for malfunction judgment by using the sensor output without external power source supply.

In addition, the current for judging may be smaller than the sensor output current.

This allows malfunction judgment without interrupting the sensor function.

In addition, the current for judging may be larger than the sensor output current.

This allows giving priority to the malfunction judgment function of the sensor, which is applicable to a case, for example, where the sensor malfunction is not allowed.

Note that the present invention may be realized as an integrated circuit which detects a malfunction in a sensor, the malfunction detection system including: a sensor connecting unit to which a sensor is connected, the sensor including a first terminal, and the sensor outputting a sensor output current that varies a voltage level of the first terminal; a current output unit which varies the voltage level of the first terminal by outputting a constant current for judging to the sensor via the first terminal; and a judging unit which judges that the sensor is malfunctioning when the current for judging causes the voltage level of the first terminal to be equal to or higher than a threshold in a period different from a first period where the sensor output current causes the voltage level of the first terminal to be equal to or higher than the threshold.

Note that the present invention may be implemented, not only as a system or an integrated circuit, but also as a method which includes the processing units configuring the system as steps. Furthermore, the present invention may be implemented as a program causing the computer to execute each step, and may also be implemented as a recording medium such as a computer-readable Compact Disc-Read Only Memory (CD-ROM) on which the program is recorded.

The present invention is applicable to various sensor outputs including pulse signals and the cost for detecting malfunction can be reduced.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

These and other objects, advantages and features of the invention will become apparent from the following description thereof taken in conjunction with the accompanying drawings which illustrate a specific embodiment of the invention. In the Drawings.

DESCRIPTION OF THE PREFERRED EMBODIMENTS

First Embodiment

The embodiments of the present invention are hereafter described with reference to the drawings.

First, the configuration of water meter to which the malfunction detection system according to the present invention can be applied is briefly described.

Figure 1:
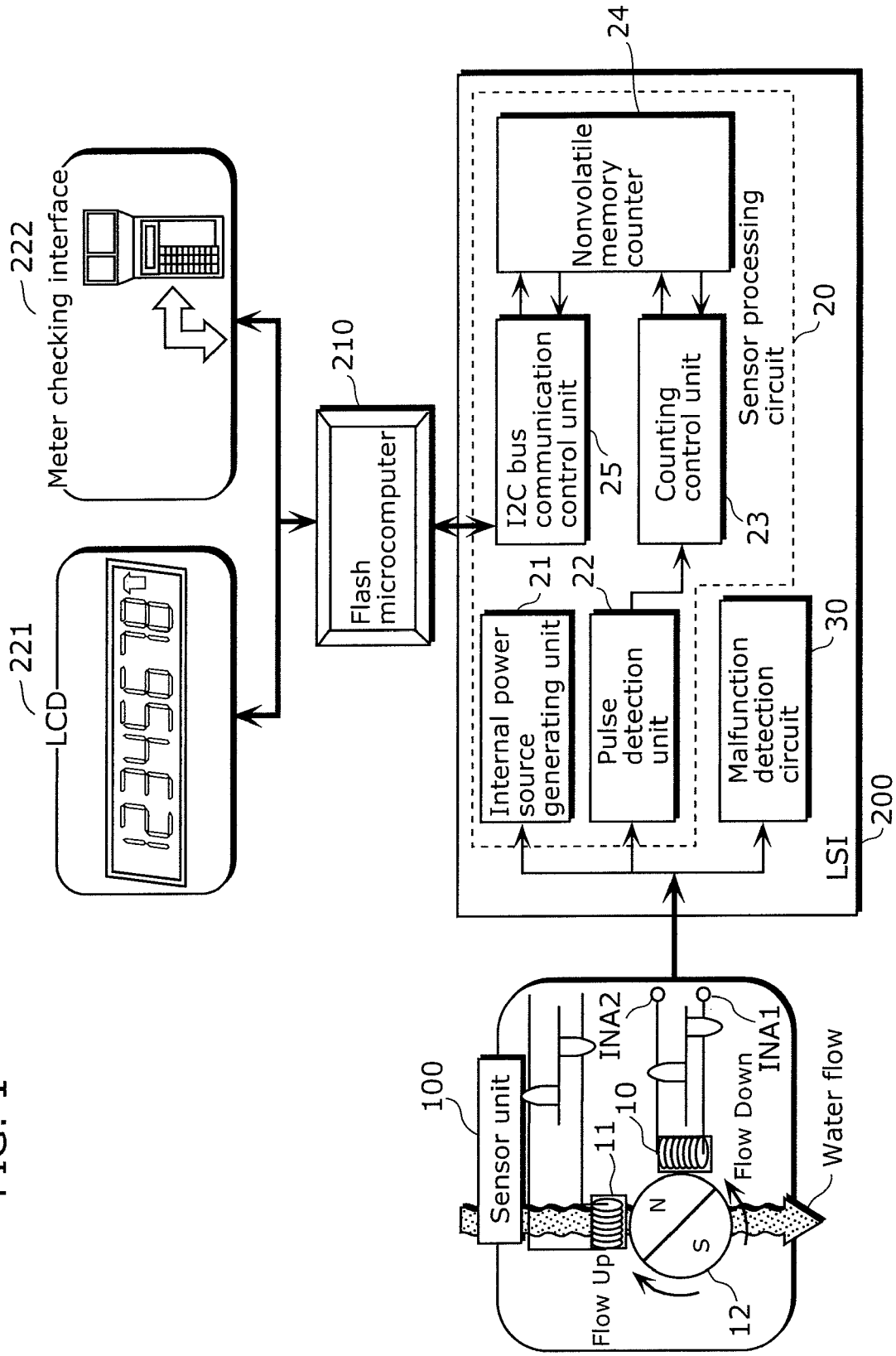
FIG. 1 shows an example of the configuration of a water meter to which the malfunction detection system according to the present invention is applicable.

FIG. 1 shows an example of water meter to which the malfunction detection system is applied. The water meter in FIG. 1 includes a sensor unit 100, a Large Scale Integration (LSI) 200, a flash microcomputer 210, a Liquid Crystal Display (LCD) 221 and a meter checking interface 222.

The sensor unit 100 includes sensors 10 and 11, and a magnet 12. In the sensor unit 100, pulse voltage is induced to each terminal of the sensors 10 and 11 by rotation of the magnet 12 with the water flow.

The LSI 200 increments or decrements a nonvolatile memory counter by detecting the pulse voltage induced at the sensor unit 100. The LSI 200 also controls Inter-Integrated Circuit (I2C) bus communication with the flash microcomputer 210. Furthermore, the LSI 200 judges whether the sensor included in the sensor unit 100 is malfunctioning or not. The LSI 200 includes a sensor processing circuit 20 and a malfunction detection circuit 30 in order to implement the process.

The sensor processing circuit 20 increments or decrements a nonvolatile memory counter by detecting the pulse voltage induced at a sensor terminal of the sensor unit 100. Furthermore, the sensor processing circuit 20 controls the I2C bus communication with the flash microcomputer 210. The sensor processing circuit 20 includes an internal power source generating unit 21, a pulse detection unit 22, a counting control unit 23, a nonvolatile memory counter 24, and an I2C bus communication control unit 25 in order to achieve the process. Note that, although the LSI 200 is driven by generating power source by the internal power source generating unit 21, the LSI 200 may be driven by a power supply from the flash microcomputer 210.

Note that the sensor processing circuit 20 may process the pulse voltages at the terminals of the two sensors 10 and 11. Furthermore, the LSI 200 may include sensor processing circuits respectively corresponding to each of the sensors 10 and 11.

The malfunction detection circuit 30 detects malfunction in the sensor included in the sensor unit 100. The details of the malfunction detection circuit 30 will be described later.

The flash microcomputer 210 performs I2C bus communication with the LSI 200, receives signals obtained through processing the pulse voltage induced at the sensor unit 100, and calculates the amount of water. For example, the flash microcomputer 210 calculates the amount of water based on the pulse count counted by the sensor processing circuit 20, and outputs the calculated amount of water to the LCD 221 and the meter checking interface 222. Furthermore, when malfunction is detected, the flash microcomputer 210 generates a signal for notifying the malfunction in the sensor externally, outputs the signal to the LCD 221, and displays that the sensor is malfunctioning.

The malfunction detection system according to the first embodiment is described.

The malfunction detection system according to the first embodiment judges malfunction in the sensor by outputting current for judging the malfunction in the sensor twice to the sensor outputting intermittent pulse signals via the terminal of the sensor and by detecting the voltage level of the terminal of the sensor in a period when the current for judging is outputted. Outputting the current for judging twice enables judgment of sensor malfunction even when either one of the current for judging overlaps a sensor output current outputted from the sensor itself. Here, the intermittent pulse signal is a signal in which pulse intermittently appears in a predetermined interval. The malfunction in sensor includes a case, for example, where the sensor has a extremely high resistance, for example. Extreme examples include a wire breakage in the sensor.

Figure 2:
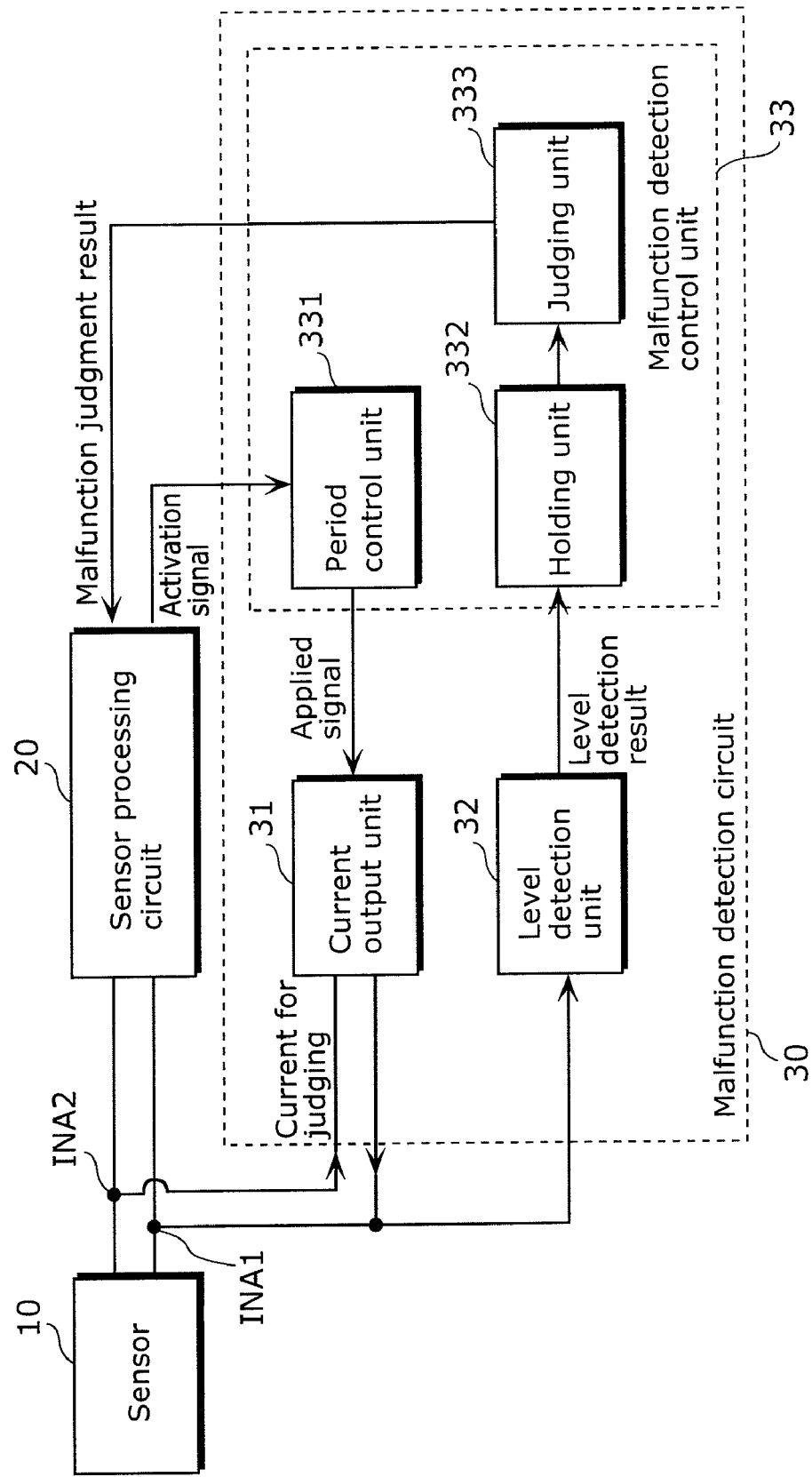
FIG. 2 is a block diagram showing the configuration of the malfunction detection system according to the first embodiment.

FIG. 2 is a block diagram showing the configuration of the malfunction detection system of the sensor according to the first embodiment. The malfunction detection system detects a malfunction in a sensor when the sensor outputs intermittent pulse signals. The malfunction detection system in FIG. 2 includes a sensor 10, a sensor processing circuit 20, and a malfunction detection circuit 30.

The sensor 10 is a resistance type sensor which has a low resistance value (for example, 100Ω or less) when functioning properly, and has a high resistance value (for example, 1 MΩ or more) when malfunctioning. The sensor 10 is connected to the sensor processing circuit 20 and the malfunction detection circuit 30 via the terminals INA1 and INA2, respectively. The sensor 10 outputs sensor output current in which the respective voltage levels of the terminals INA1 and INA2 are intermittent pulse signals. The minimum value of the interval of appearance of pulse included in the intermittent pulse signal is determined by the specification of the sensor 10. Note that the terminal INA1 is a terminal to which the current for judging flows into the sensor 10. The terminal INA2 is a terminal from which the current for judging flows out of the sensor 10.

The sensor processing circuit 20 is the same as the sensor processing circuit 20 in FIG. 1, and the description is omitted. Note that the sensor processing circuit 20 outputs an activation signal for starting malfunction detection processing.

The malfunction detection circuit 30 detects the malfunction in the sensor 10 by outputting the current for judging to the sensor 10 via the terminal INA1, and detecting the voltage level of the terminal INA1. The malfunction detection circuit 30 includes a current output unit 31, a level detection unit 32, and a malfunction detection control unit 33.

The current output unit 31 outputs the current for judging to the sensor 10 via the terminal INA1 based on the applied signal inputted from the malfunction detection control unit 33. The current for judging that has passed the sensor 10 is inputted to the current output unit 31 via the terminal INA2. The current output unit 31 outputs the current for judging during a period where the applied signal is in Hi-level. Note that the current for judging has a value smaller than the sensor output current outputted by the sensor 10. This is to prevent interference on the detection function of the sensor 10 by the current for judging. Here, the current for judging is, for example, a current at 30 µA.

The level detection unit 32 detects the voltage level of the terminal INA1 during the period where the current for judging is outputted to the sensor 10. More specifically, the predetermined threshold and the voltage level of the terminal INA1 are compared. The signal which is Hi-level, according to the comparison, during the period where the voltage level of the terminal INA1 is outputted to the malfunction detection control unit 33 as the level detection result.

The malfunction detection control unit 33 performs control related to the malfunction detection according to the first embodiment. More specifically, the malfunction detection control unit 33 controls output of the current for judging, and judgment of the malfunction in the sensor based on the level detection result. In order to achieve the process, the malfunction detection control unit 33 includes a period control unit 331, a holding unit 332, and a judging unit 333.

The period control unit 331 outputs, to the current output unit 31, an applied signal for controlling the period where the current for judging is outputted, based on an activation signal inputted from the sensor processing circuit 20. The applied signal is a pulse signal which includes two Hi-level periods. The current output unit 31 outputs the current for judging during the two periods where the applied signal is in Hi-level. With this, in the malfunction detection system according to the first embodiment, judging process is performed twice.

The holding unit 332 holds the result of level detection.

The judging unit 333 judges whether the sensor 10 is malfunctioning or not based on the result of level detection. Here, NG denotes that the result of level detection is in Hi-level during the period when the current for judging is outputted. Here, OK denotes that the result of level detection is in Lo-level during the period when the current for judging is outputted. The judging unit 333 judges that the sensor 10 is malfunctioning when both periods where the current for judging is outputted are judged as NG. The judging unit 333 determines that the sensor 10 is normally functioning when one of two periods is judged as OK. The result judged based on the judgment condition is outputted to the sensor processing circuit 20 as the malfunction judgment result.

Figure 3:
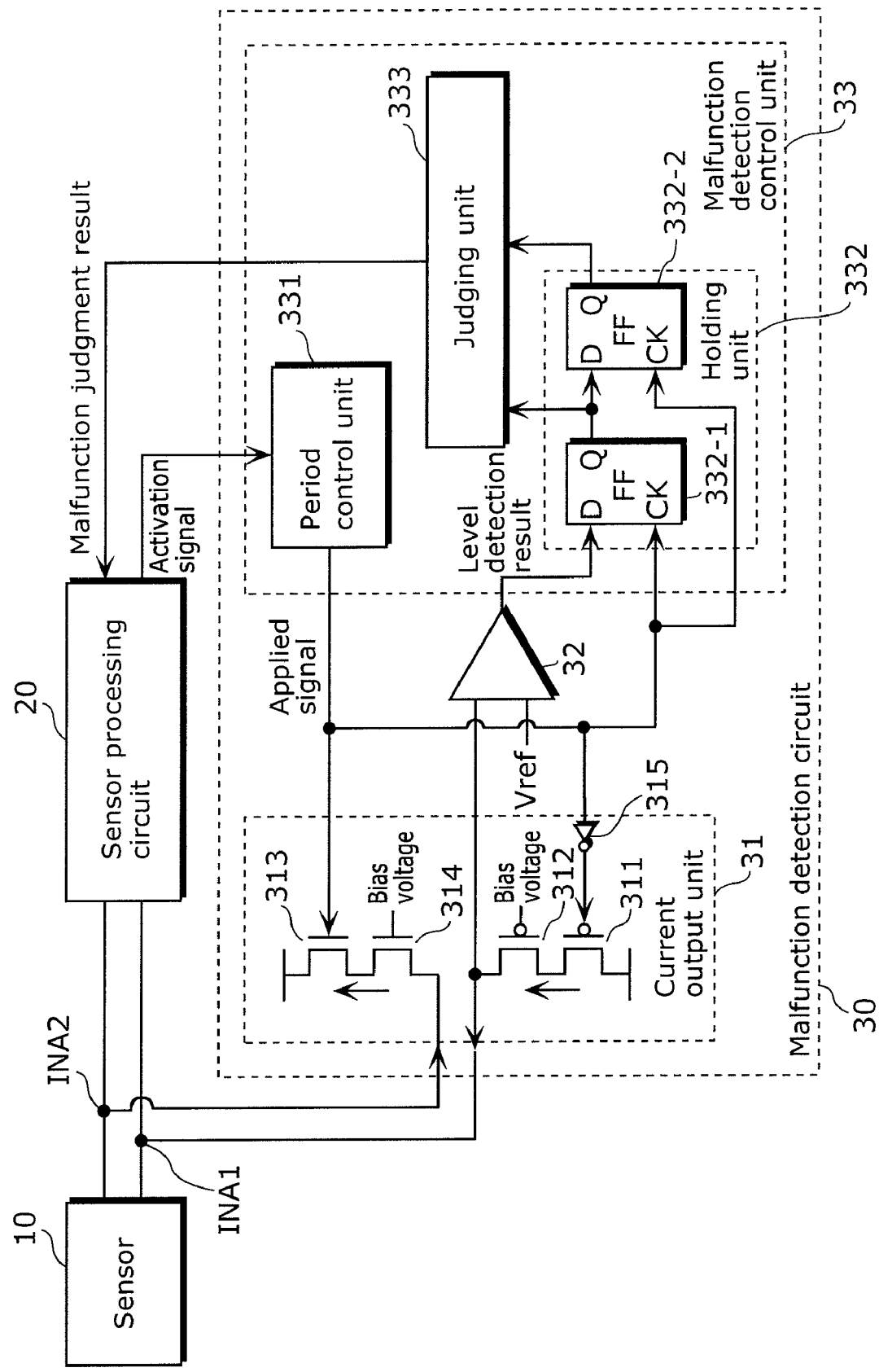
FIG. 3 shows details of the malfunction detection circuit according to the first embodiment.

FIG. 3 indicates the detail of malfunction detection circuit 30.

As shown in FIG. 3, the current output unit 31 includes p-channel Metal Oxide Semiconductors (MOS) 311 and 312, n-channel MOS transistors 313 and 314, and an NOT circuit 315.

The p-channel MOS transistor 311 and the n-channel MOS transistor 313 switches conduction and non-conduction by the applied signal applied to the gates. The gate of the p-channel MOS transistor 311 is connected to the NOT circuit 315 and inversed applied signal is inputted to the gate of the p-channel MOS transistor 311. The original applied signal is inputted to the gate of the n-channel MOS transistor 313. With this, the p-channel MOS transistor 311 and the n-channel MOS transistor 313 are conducted when the applied signal is in Hi-level.

Bias voltage is applied to the respective gates of the p-channel MOS transistor 312 and the n-channel transistor 314, and the p-channel MOS transistor 312 and the n-channel transistor 314 function as constant current sources that output current for judging. The bias voltage applied to the gate of the p-channel MOS transistor 312 is determined such that the p-channel MOS transistor 312 outputs a current at 30 µA. The bias voltage applied to the gate of the p-channel MOS transistor 312 is determined such that the n-channel MOS transistor 314 outputs current slightly larger than 30 µA. Note that the n-channel MOS transistors 313 and 314 are provided to maintain stability of the current for judging. The n-channel MOS transistors 313 and 314 prevents malfunction in other circuits caused by the judging current flowing into the other circuits, such as the sensor processing circuit 20.

The current output unit 31 outputs the current for judging to the sensor 10 during a period when the applied signal outputted from the period control unit 331 is in Hi-level.

The level detection unit 32 is a comparator as shown in FIG. 3. One of the terminals of the comparator for comparison is connected to the terminal INA1, and the other terminal is connected to the power source for reference, which is the threshold. The voltage level of the terminal INA1 is compared with the reference voltage Vref, and a Hi-level signal is outputted to the holding unit 332 when the voltage level of the terminal INA1 is larger than Vref. Note that Vref is, for example, 1.2 V.

The holding unit 332 includes two flip-flops including the flip-flops 332-1 and 332-2. The flip-flop 332-2 holds the level detection result when the first current for judging flows. The flip-flop 332-1 holds the level detection result when the second current for judging flows. Applied signals are inputted as clock signals of the flip-flops 332-1 and 332-2. The flip-flops 332-1 and 332-2 hold the output of the level detection unit 32 when the pulse of the applied signal falls.

Note that the applied signal inverted using the NOT circuit may be inputted to each flip-flop as clock signals, and output of the level detection unit 32 is held when the inverted signal of the applied signal rises.

Figure 4:
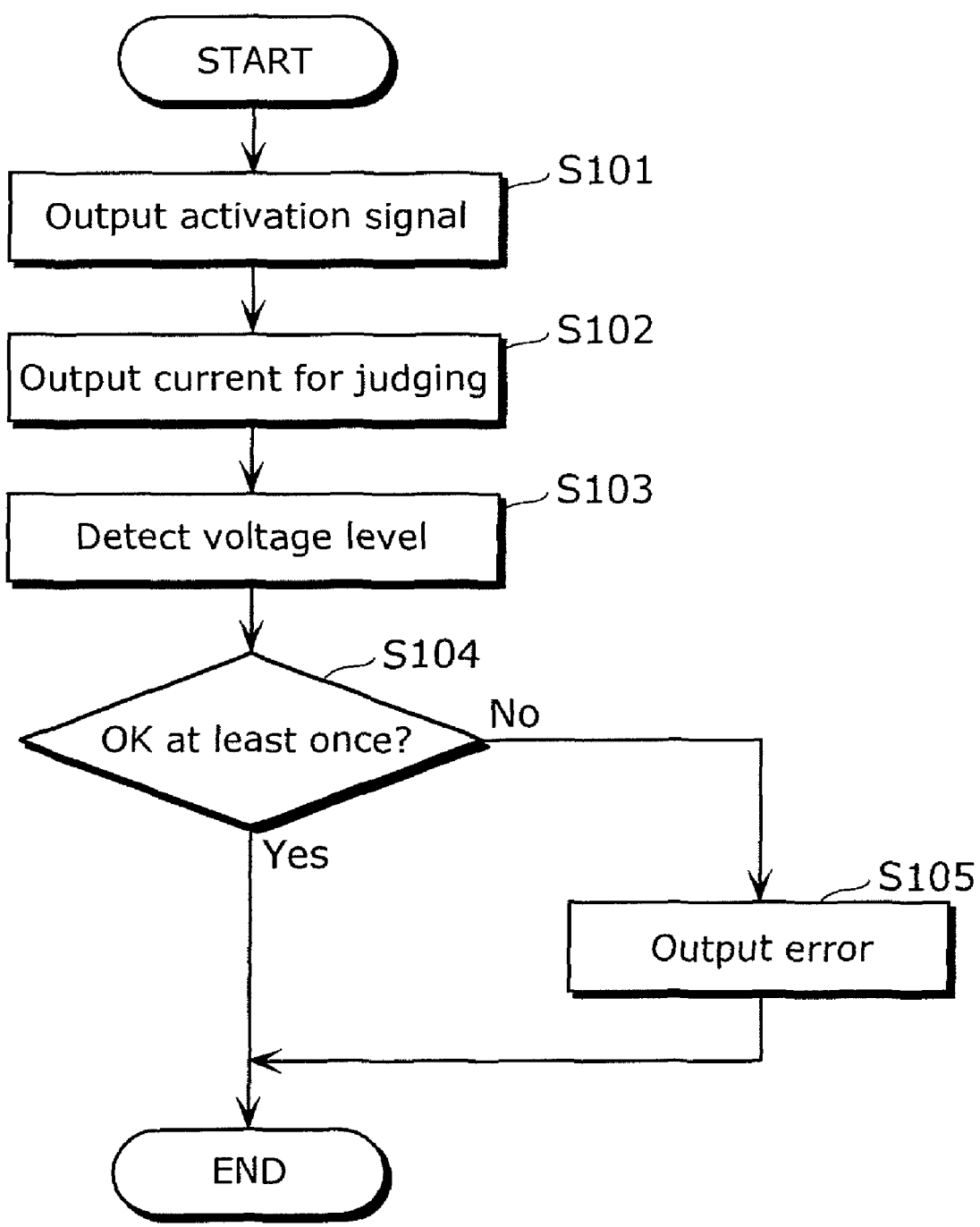
FIG. 4 is a flowchart showing the operation of the malfunction detection system according to the first embodiment.

Next, the operation of the malfunction detection system according to the first embodiment is described. FIG. 4 is a flowchart showing the operation of the malfunction detection system according to the first embodiment.

First, the sensor processing circuit 20 outputs the activation signal (S101).

Note that the output of the activation signal may be performed in any timing. For example, the activation signal may be regularly outputted at a constant interval by using a timer. Alternatively, the activation signal may be outputted at a predetermined time, for example, immediately after the sensor 10 is activated. The activation signal may also be outputted by an instruction from outside. Furthermore, the activation signal may be outputted according to the voltage level of the terminal INA1, for example, when the voltage level reaches 0.

Next, the period control unit 331 to which the activation signal is inputted outputs the applied signal, and the current output unit 31 to which the applied signal is inputted outputs the current for judging to the sensor 10 (S102). Furthermore, the level detection unit 32 detects the voltage level of the terminal INA1 (S103). The detected result is outputted to the holding unit 332, and the holding unit 332 holds, according to the timing of the pulse of the applied signal, the voltage level during a period when the current for judging is outputted as the level detection result.

The judging unit 333 obtains the level detection result held by the holding unit 332, and judges whether the sensor is malfunctioning based on the judgment condition (S104). More specifically, the judging unit 333 judges whether the level detection result includes at least one period where the level detection result does not exceed the threshold (OK).

When there is no OK, more specifically, the level detection results exceed the threshold in both periods (No in S104), the judging unit 333 outputs a signal indicating that the sensor 10 is malfunctioning to the sensor processing circuit 20 as the malfunction judgment result (S105).

When there is OK at least once (Yes in S104), the malfunction detection process ends. Note that the signal indicating that the sensor 10 is normally functioning may be outputted to the sensor processing circuit 20 as the malfunction judgment result.

The process by the malfunction detection system according to the first embodiment is hereafter described using the time charts and showing specific waveforms when the sensor is normally functioning and when the sensor is malfunctioning.

Figure 5:
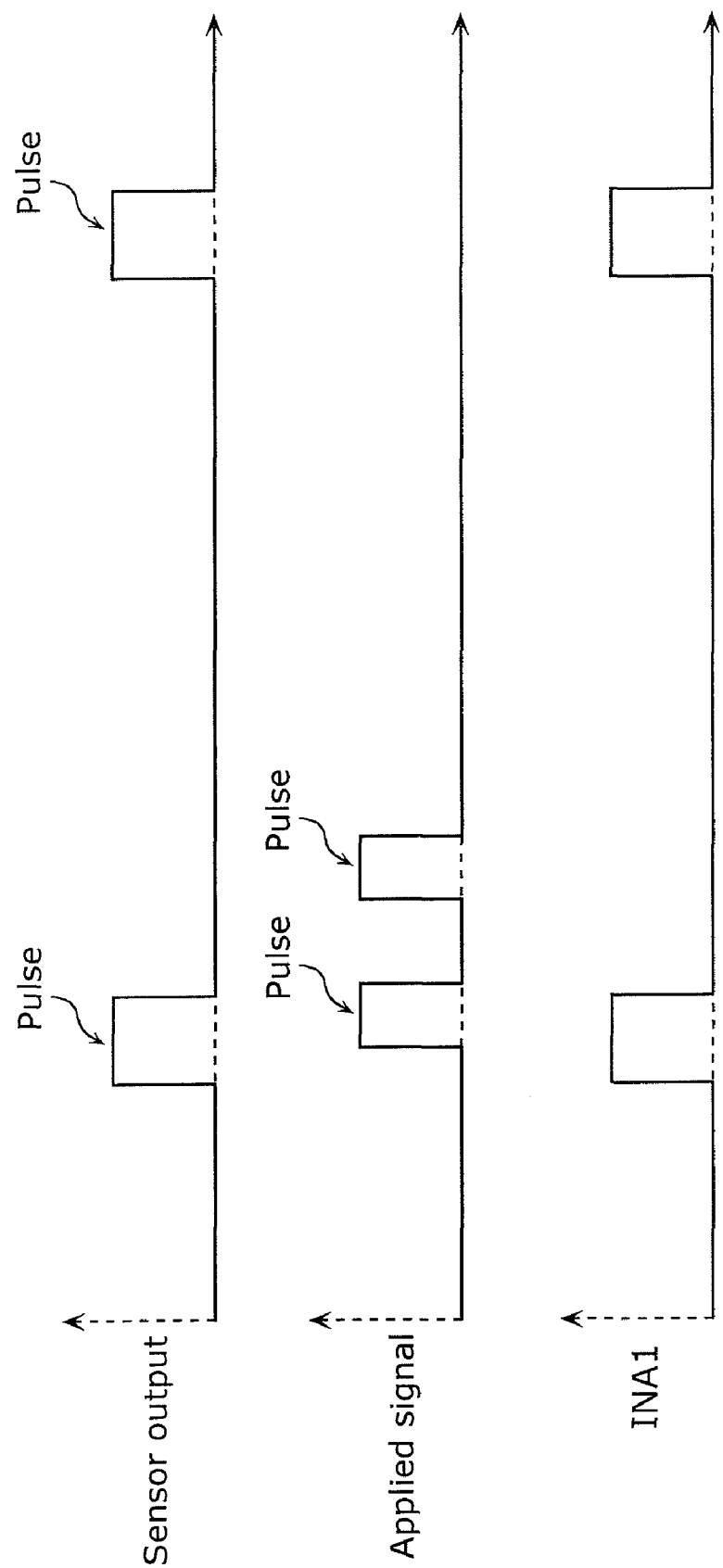
FIG. 5 is a time chart showing the relationship of the sensor output, the applied signal, and the voltage level of the sensor terminal when the sensor is functioning normally.

FIG. 5 is a time chart showing the relationship of the sensor output, the applied signal, and the voltage level of the sensor terminal when the sensor is normally functioning.

As shown in the diagram, when the sensor 10 is normal, with the applied signal, the voltage level of the terminal INA1 is rarely affected even if the current for judging is outputted to the sensor 10. When the sensor 10 is normally functioning, the resistance value of the sensor 10 is extremely low (100Ω or less). Thus, the potential difference between the terminal INA1 and the terminal INA2 in the sensor 10 is extremely lower than the reference voltage Vref set in the level detection unit 32. Thus, when the sensor 10 is normally functioning, the voltage level of the terminal INA1 may vary only due to the sensor output current outputted from the sensor 10.

Figure 6:
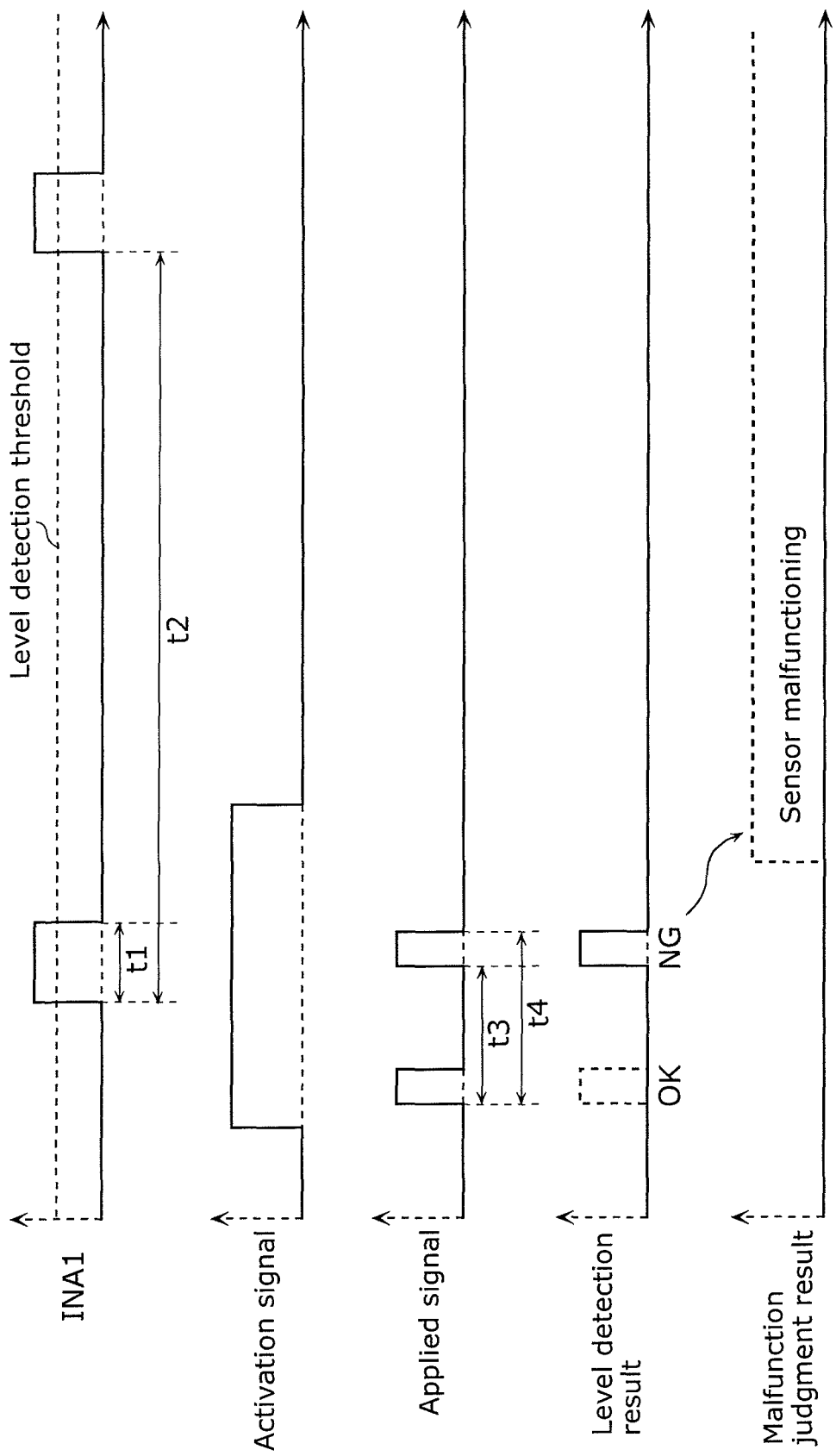
FIG. 6 is a time chart showing output of each component of the malfunction detection system when the sensor which outputs intermittent pulse signals is functioning normally.

FIG. 6 is a time chart showing output of each component of the malfunction detection system when the sensor which outputs intermittent pulse signals is functioning normally.

The sensor 10 outputs a pulse which has a period t1 where the pulse exceeds the level detection threshold. Furthermore, the second pulse is outputted after the period t2 from the point in time when the first pulse is outputted. Note that the maximum value of the period t1 and the minimum value of t2 are determined in advance in the specification of the sensor 10.

As shown in FIG. 6, the applied signal is outputted in response to the activation signal. More specifically, in a period where the activation signal is in Hi-level, an applied signal including two pulses is outputted. The period control unit 331 controls the output period of the applied signal in such a manner that the second pulse is outputted after the period t3 from the point in time when the first pulse is outputted, and the output of the second pulse ends after the period t4 ($\geq$t3) from the point in time when the first pulse is outputted. The periods t3 and t4 are determined to satisfy the following formulas 1 and 2.

$t3 \geq$ maximum value of t1     (Formula 1)

$t4 \leq$ minimum value of t2     (Formula 2)

Note that although FIG. 6 shows output of applied signal during a period where the activation signal is in Hi-level, the activation signal may be any signal as long as it functions as a trigger for outputting the applied signal.

The level detection results show the result of detection of the voltage level of the terminal INA1 in a period where the applied signal is in Hi-level, in other words, when the current for judging is outputted to the sensor 10. As shown in FIG. 6, in the first period, it is judged as OK (sensor not malfunctioning) since the voltage level of the terminal INA1 is below the level detection threshold. In the second period, it is judged as NG (sensor possibly malfunctioning) since the voltage level of the terminal INA1 exceeds the level detection threshold.

The malfunction judgment result shows the signal generated by the judging unit 333 based on the level detection result. As shown in FIG. 6, the level detection result shows one OK and one NG, and the sensor is judged as normal since the condition that the level detection result includes at least one OK. Thus, the malfunction judgment result remains in Lo-level. It should be noted that the malfunction judgment result remaining in Lo-level indicates normal operation of the sensor 10, the malfunction judgment result remaining in Hi-level indicates malfunction in the sensor 10.

Next, a case where the sensor is malfunctioning is described.

Figure 7:
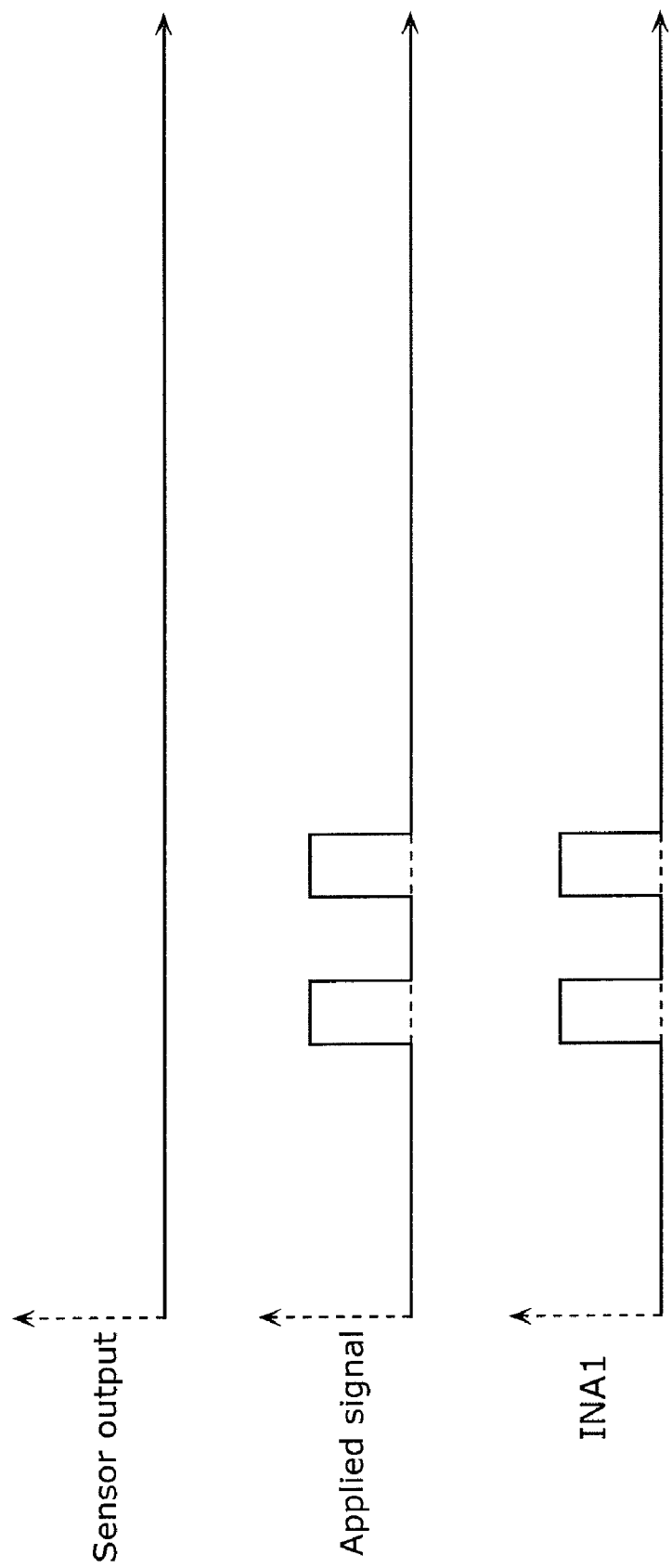
FIG. 7 is a time chart showing the relationship of the sensor output, the applied signal, and the voltage level of the sensor terminal when the sensor is malfunctioning.

FIG. 7 is a time chart showing the relationship of sensor output, applied signal, and the voltage level of the sensor terminal when the sensor is malfunctioning.

FIG. 7 shows a case where there is no pulse generated in normal operation to illustrate an example of malfunction in the sensor 10. Since the sensor 10 has extremely high resistance due to malfunction, when the current for judging is outputted to the sensor 10 by the applied signal, the potential of the terminal INA1 to which the current for judging flows is high. Therefore, the voltage level of the terminal INA1 remains high during the period where the applied signal is in Hi-level, more specifically, for the period when the current for judging is outputted.

Figure 8:
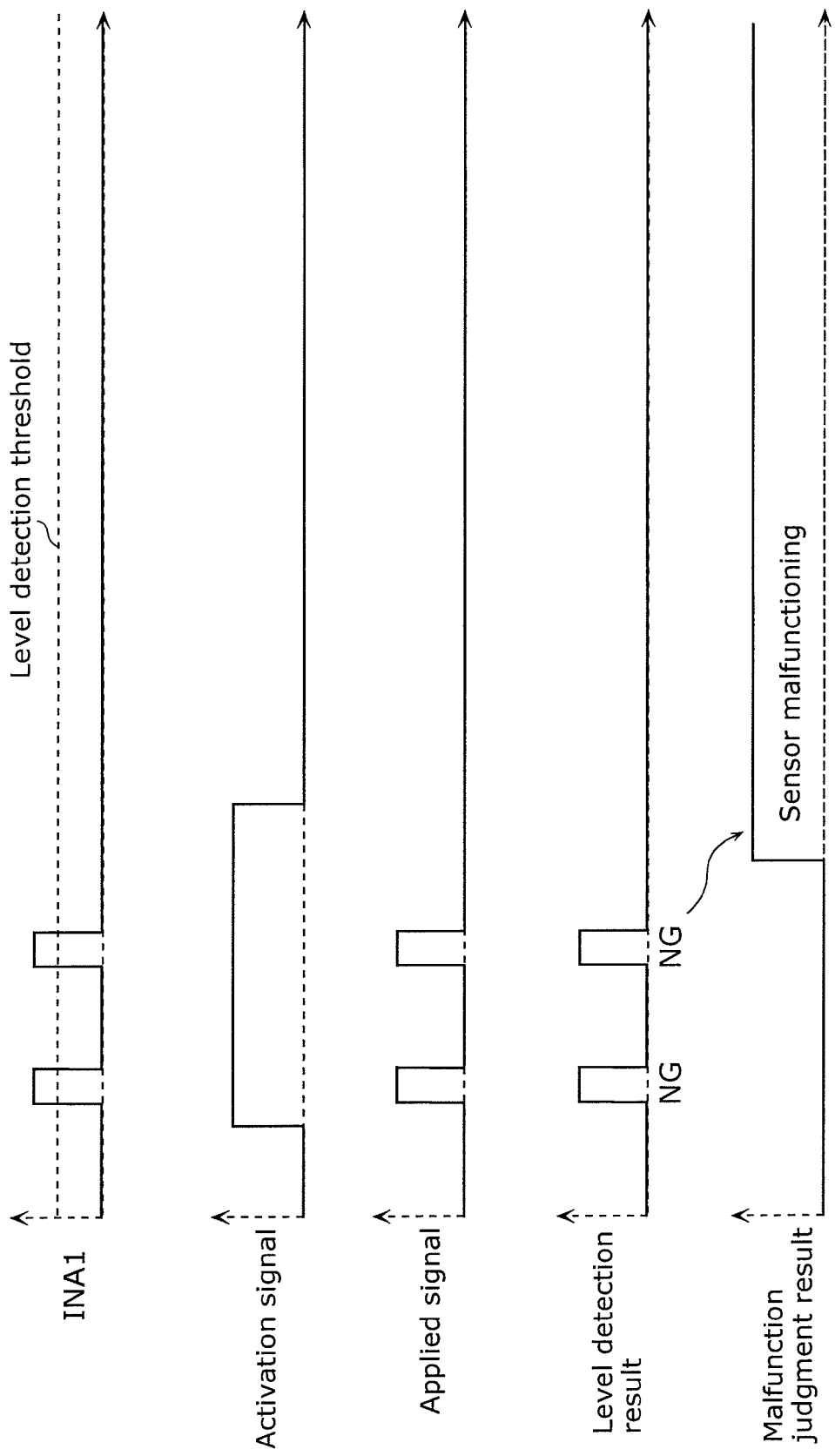
FIG. 8 is a time chart showing output of each component of the malfunction detection system when the sensor which outputs intermittent pulse signals is malfunctioning.

FIG. 8 is a time chart showing output of each component of the malfunction detection system when the sensor which outputs intermittent pulse signals is malfunctioning.

As shown in FIG. 8, the voltage level of the terminal INA1 exceeds the level detection threshold due to the current for judging by the applied signal. Therefore, the detection of voltage level of the terminal INA1 during the period when the current for judging is outputted would always be judged as NG. This will result in two periods judged as NG, and the sensor is judged as being malfunctioning. The malfunction judgment result in Hi-level is outputted to the sensor processing circuit 20.

As described above, in the malfunction detection system according to the first embodiment, outputting the current for judging at least in two periods enables detection of the sensor malfunction even when one of the periods overlaps the period when the sensor output current is outputted.

Furthermore, the current for judging may not be constantly outputted in the first embodiment. This is more effective than the technique shown in the Japanese Unexamined Patent Application Publication No. 2004-294442, in which the bias current is always outputted, for reducing the consumption current.

Note that, the power source used for driving the LSI 200 which includes the above malfunction detection circuit 30 by using the sensor output current in the sensor 10 in the present invention.

Figure 9:
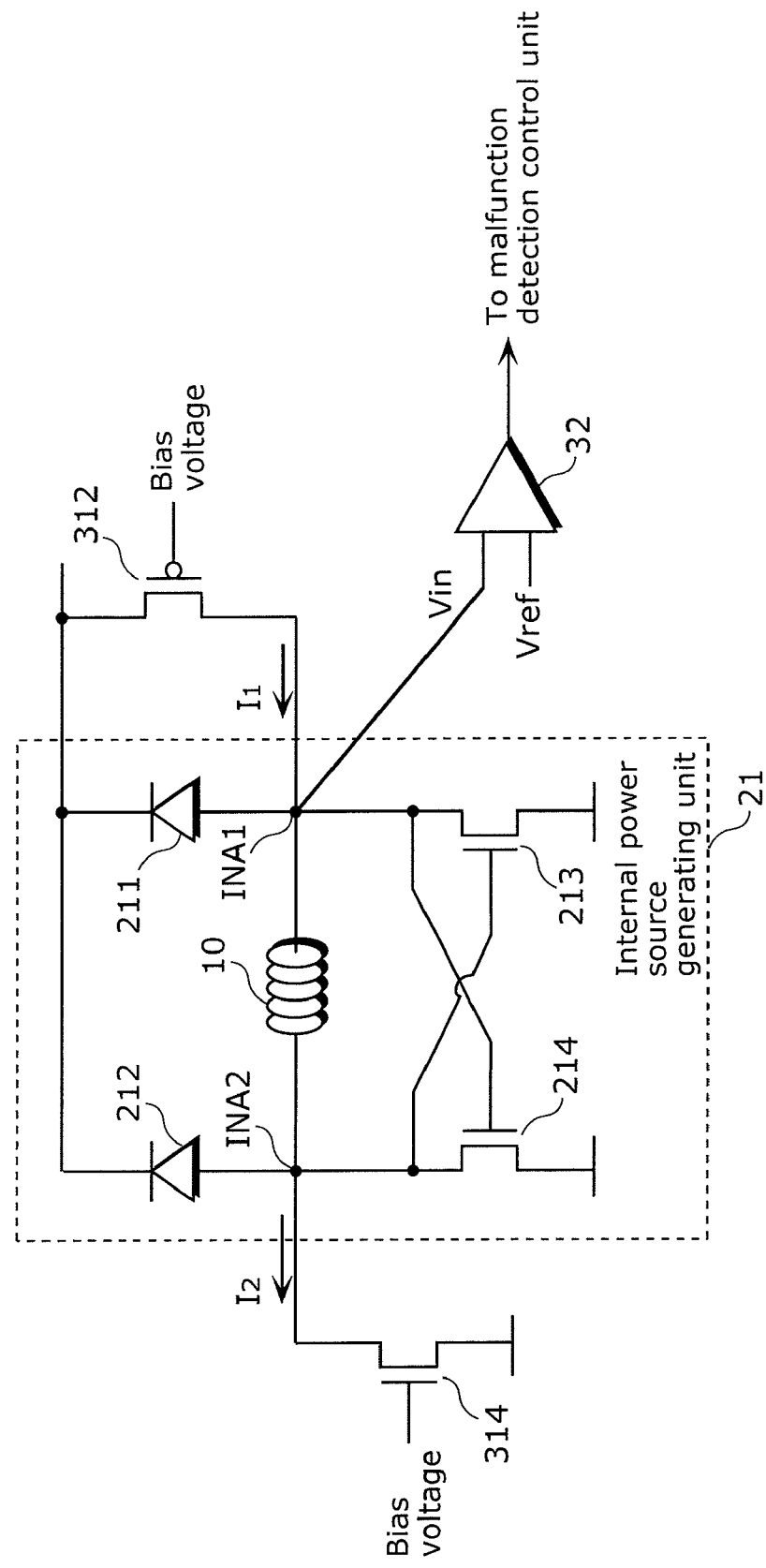
FIG. 9 shows the circuit structure of the internal power source generating unit.

FIG. 9 is an example showing the circuit structure of the internal power source generating unit 21. The internal power source generating unit 21 in FIG. 9 includes diodes 211 and 212, n-channel MOS transistors 213 and 214.

The anode of the diode 211 is connected to the terminal INA1. The anode of the diode 212 is connected to the terminal INA2. The cathode of the diode 211 and the cathode of the diode 212 are connected, and the connecting point functions as the output terminal of the power source of the internal power source generating unit 21. The current outputted from the connecting point is outputted to the p-channel MOS transistor 312 for generating the current for judging, for example.

The gate of the n-channel MOS transistor 213 and the drain of the n-channel MOS transistor 214 are connected to the terminal INA2. The drain of the n-channel MOS transistor 213 and the gate of the n-channel MOS transistor 214 are connected to the terminal INA1. The source of the n-channel MOS transistor 213 and the source of the n-channel MOS transistor 214 are connected to ground.

The internal power source generating unit 21 is described hereafter.

The sensor output current outputted from the sensor 10 induces voltages at the terminals INA1 and INA2. Here, it is assumed that the voltage which makes the potential of the terminal INA1 higher than that of the terminal INA2. The voltage level of the terminal INA1 being in Hi-level raises the voltage level of the gate of n-channel MOS transistor 214 to Hi-level. This conducts the n-channel MOS transistor 214. Subsequently, the level of the terminal INA2 is in Lo-level, which opens the n-channel MOS transistor 213. This allows the current outputted from the terminal INA1 to each processing unit included in the LSI 200 through the diode 211. When the potential of the terminal INA2 is higher than that of the terminal INA1, the current is outputted to each processing unit through the diode 212 in the same manner.

As described above, the output current of the sensor 10 is used for driving the LSI 200.

Second Embodiment

The malfunction detection system according to the second embodiment judges malfunction in the sensor by outputting current for judging the malfunction in the sensor multiple times and by detecting the voltage level of the terminal of the sensor in a period when the current for judging is outputted, to the sensor outputting alternating current signals via the terminal of the sensor.

Figure 10:
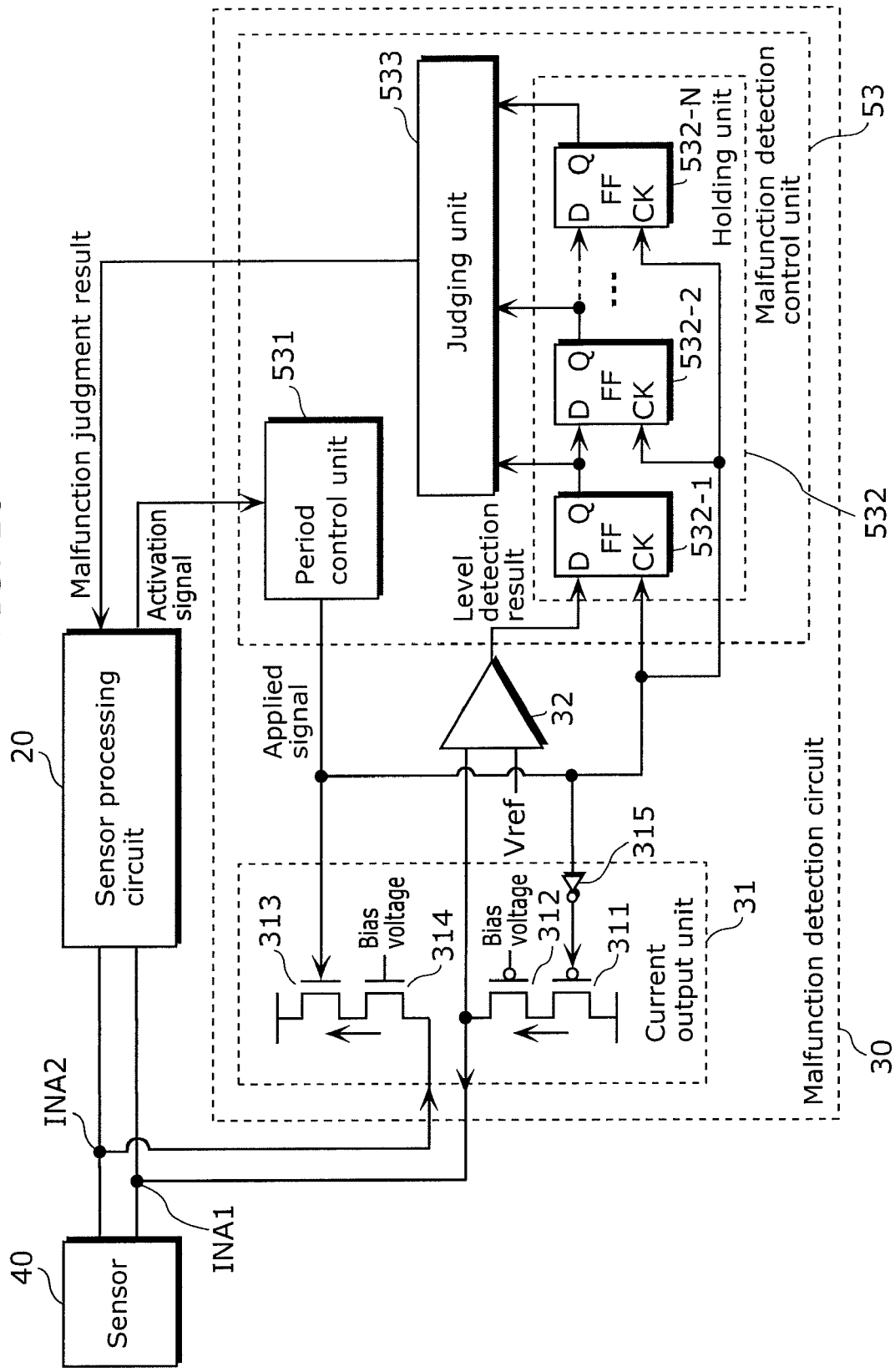
FIG. 10 is a block diagram showing the configuration of the malfunction detection system according to the second embodiment.

FIG. 10 specifically shows details of the malfunction detection circuit in the configuration of the malfunction detection system according to the second embodiment. The malfunction detection system according to the second embodiment is different from the malfunction detection system according to the first embodiment in that a sensor 40 and a malfunction detection control unit 53 are included instead of the sensor 10 and the malfunction detection control unit 33, respectively. Hereafter, descriptions for the components which are the same as the first embodiment are omitted, and the descriptions will be made focusing on the difference.

The sensor 40 is a resistance type sensor which has a low resistance value (for example, 100Ω or less) when functioning properly, and has a high resistance value (for example, 1 MΩ or more) when malfunctioning. The sensor 40 is connected to the sensor processing circuit 20 and the malfunction detection circuit 30 via the terminals INA1 and INA2, respectively. The sensor 40 outputs the sensor output current which causes the respective voltage levels of the terminals INA1 and INA2 to be alternating current signals. The minimum value and the maximum value of cycle of the alternating current signal are determined by the specification of the sensor 40.

The malfunction detection control unit 53 performs control related to the malfunction detection according to the second embodiment. More specifically, the malfunction detection control unit 53 controls output of the current for judging, and judgment of the malfunction in the sensor based on the level detection result. The malfunction detection control unit 53 includes a period control unit 531, a holding unit 532, and a judging unit 533 in order to achieve the process.

The period control unit 531 outputs, to the current output unit 31, an applied signal for controlling the period where the current for judging is outputted, based on an activation signal inputted from the sensor processing circuit 20. The applied signal is a pulse signal which includes N hi-level periods in total. The current output unit 31 outputs the current for judging during the n periods where the applied signal is in Hi-level. More specifically, in the malfunction detection system according to the second embodiment, judging process is performed N times.

The holding unit 532 holds the level detection results inputted from the level detection unit 32. The holding unit 532 includes n flip-flops including a flip-flop 532-1, a flip-flop 532-2, and a flip-flop 532-N. The flip-flops 532-1, 532-2 ... and 532-N hold the level detection results of $N^{th}$ time, $N-1^{th}$ time ... $1^{st}$ time, respectively.

The judging unit 533 judges whether the sensor 40 is malfunctioning or not based on the level detection results. Note that NG denotes that the level detection result is in Hi-level during the period where the current for judging is outputted, in the same manner as shown in the first embodiment. OK denotes that the level detection result is in Lo-level during the period where the current for judging is outputted. The judging unit 533 judges that the sensor 40 is malfunctioning when all of the N periods where the current for judging is outputted are judged as NG. In other words, when there is at least one level detection result judged as OK, it is determined that the sensor 40 is functioning normally. The result judged based on the judgment condition is outputted to the sensor processing circuit 20 as the malfunction judgment result.

Figure 11:
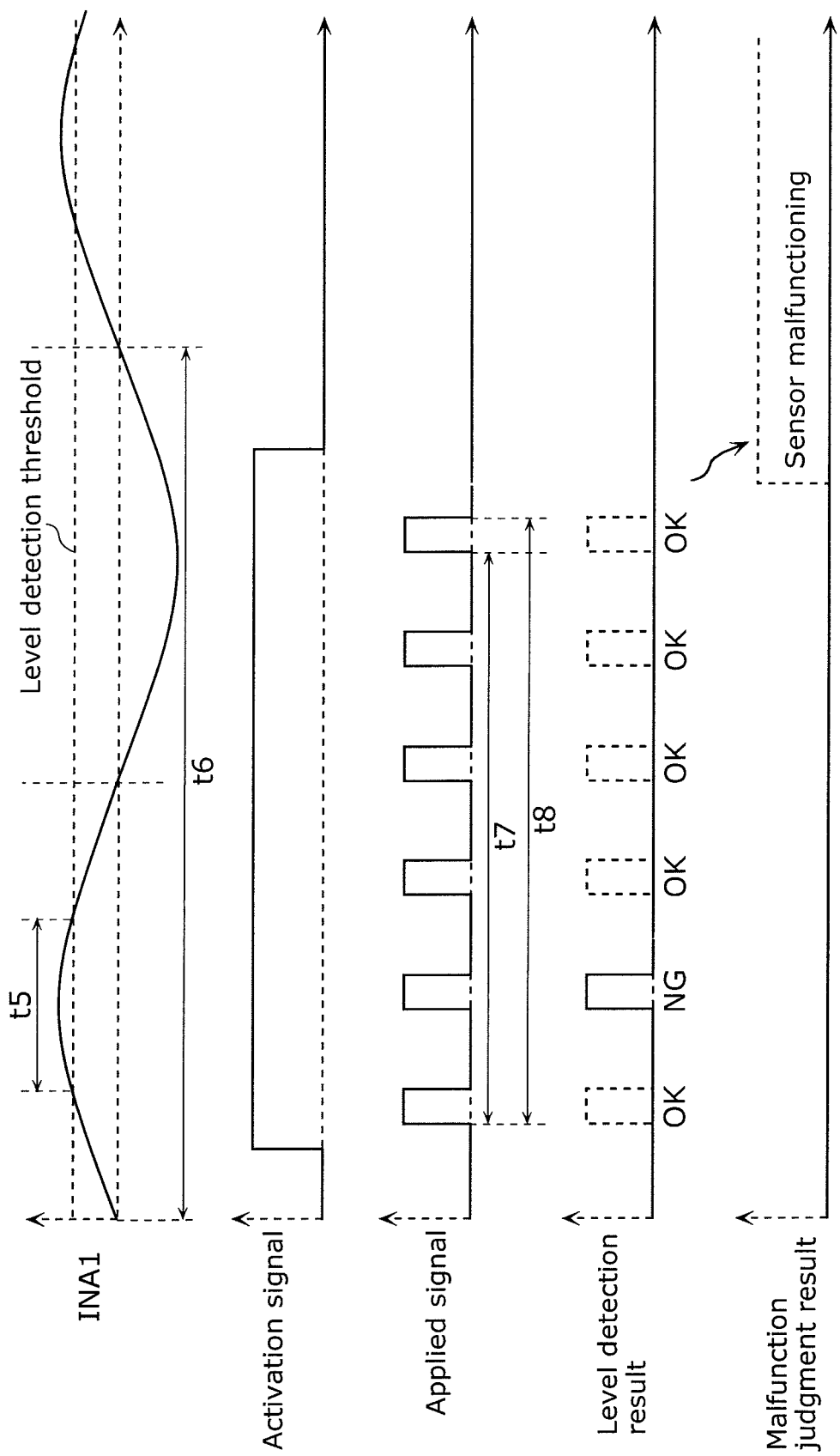
FIG. 11 is a time chart showing output of each component of the malfunction detection system when the sensor which outputs alternating current signals is functioning normally.

FIG. 11 is a time chart showing output of each component of the malfunction detection system when the sensor which outputs alternating current signals is functioning normally.

The sensor 40 outputs the sensor output current which causes the voltage level of the terminal INA1 to be an alternating current signal. The period t5 shows a period from a period in time when the voltage level of the terminal INA1 becomes equal to or more than the level detection threshold to the point in time when the voltage level becomes equal to or less than the level detection threshold. The maximum value of the period t5 is determined by the specification of the sensor 40 and the level detection threshold in advance. The period t6 is a cycle of an alternating current signal. The minimum value of the period t6 is determined in advance in the specification of the sensor 40.

As shown in FIG. 11, the applied signal is outputted in response to the activation signal. The applied signal includes N pulses. The period control unit 531 controls the output period of the applied signal in such a manner that the last (Nth) pulse is outputted after the period t7 from the point in time when the first pulse is outputted, and the output of the last pulse is terminated after the period t8 (>t7) from the point in time when the first pulse is outputted. The periods t7 and t8 are determined to satisfy the following formulas 3 and 4, respectively.

$$t7 > \text{maximum value of } t5 \quad \text{(Formula 3)}$$

$$t8 < \text{minimum value of } t6 \quad \text{(Formula 4)}$$

Note that although FIG. 11 shows output of applied signals during a period where the activation signal is in Hi-level as shown in the first embodiment, the activation signals may be any signal as long as it functions as a trigger for outputting the applied signal.

The level detection result shows the detection result of the voltage of the terminal INA1 in the period where the applied signal is in Hi-level, more specifically, in a period where the current for judging is outputted to the sensor 40. As shown in FIG. 11, in the first period, it is judged as OK (sensor not malfunctioning) since the voltage level of the terminal INA1 is below the level detection threshold. In the second period, it is judged as NG (sensor possibly malfunctioning) since the voltage level of the terminal INA2 exceeds the level detection threshold. Hereafter, it is judged as OK or NG in all of N periods in the same manner, where the application signal is outputted.

The malfunction judgment result shows a signal generated by the judging unit 533 based on the level detection result. As shown in FIG. 11, the level detection result shows one NG, and OK for the rest of the periods, which satisfies the condition where at least one OK is included. Thus, the sensor is judged as functioning normally, and the malfunction judgment result remains in Lo-level.

Figure 12:
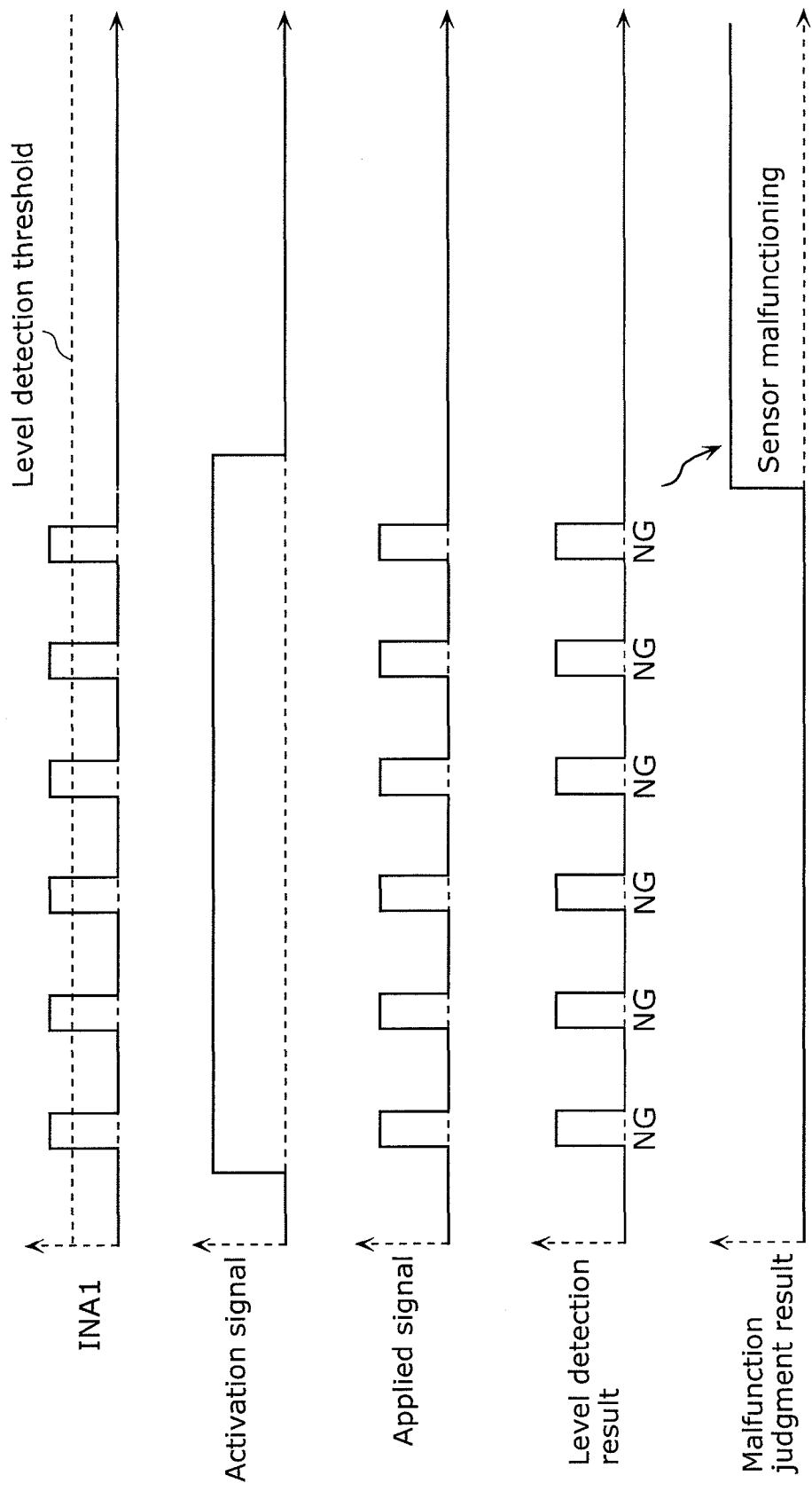
FIG. 12 is a time chart showing output of each component of the malfunction detection system when the sensor which outputs alternating current signals is malfunctioning.
Figure 13:
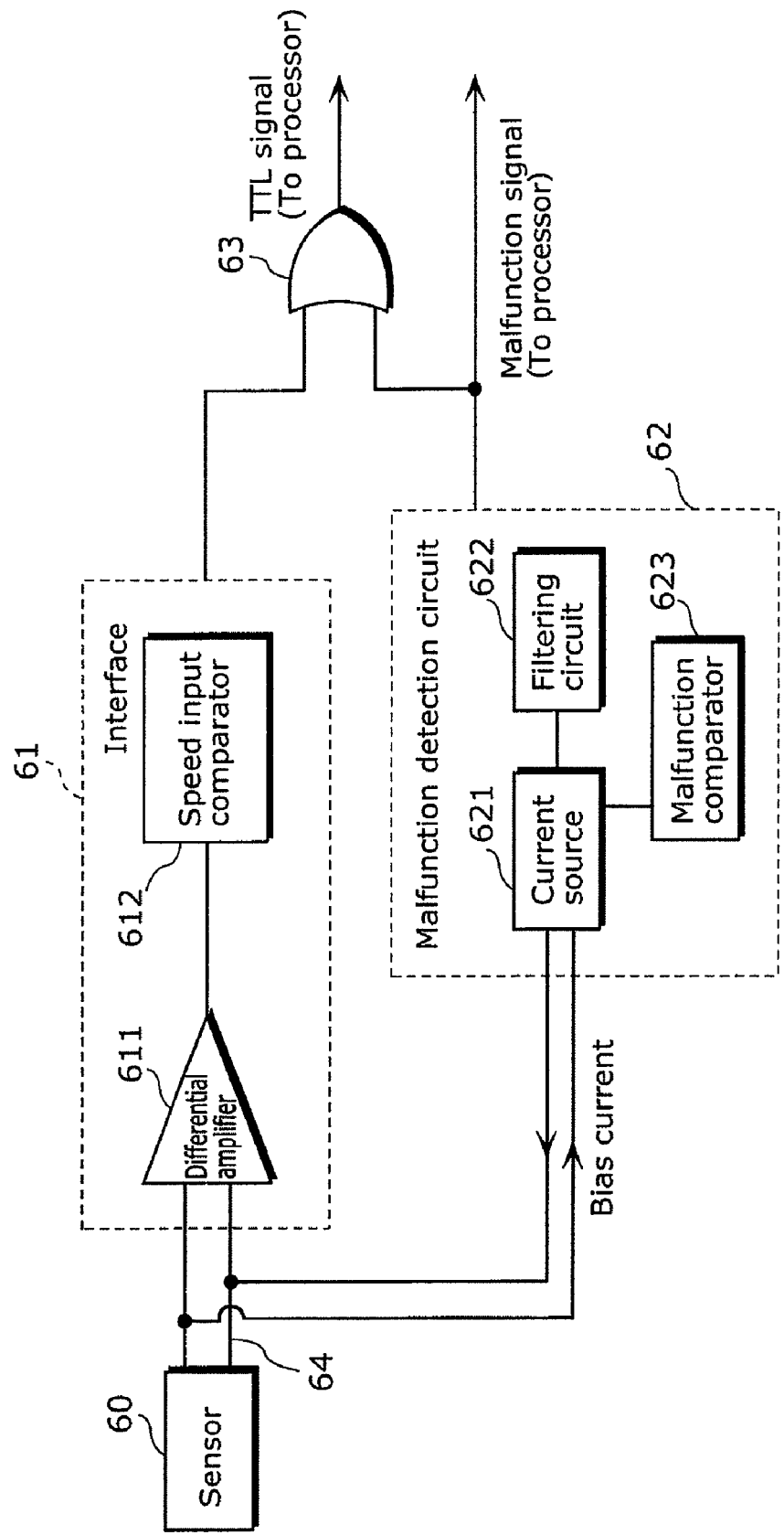
FIG. 13 is a block diagram showing the configuration of the conventional malfunction detection system.

FIG. 12 is a time chart showing output of each component of the malfunction detection system when the sensor which outputs alternating current signals is malfunctioning.

As shown in the first embodiment, the voltage level of the terminal INA1 exceeds the level detection threshold due to output of the current for judging by the applied signal. Therefore, the detection of voltage level during the period when the current for judging is outputted would always be judged as NG. This will result in all (N) periods judged as NG, and the sensor is judged as being malfunctioning. The malfunction judgment result is in Hi-level, and is outputted to the sensor processing circuit 20.

As described above, in the malfunction detection system according to the second embodiment, outputting the current for judging multiple times enables the detection of the sensor malfunction even when at least one of the periods overlaps the period where the voltage level of the terminal exceeds a predetermined threshold due to the sensor output current.

Although only some exemplary embodiments of the malfunction detection system according to the present invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

For example, although the current for judging is outputted more than twice in the second embodiment, the current for judging may be outputted once.

In this case, it is necessary that the periods where the current for judging is outputted and where the sensor output current is outputted are different from each other. Thus, the sensor processing circuit 20 monitors the voltage level of the terminal INA1, and outputs the activation signal immediately after the voltage level of the terminal INA1 exceeds the threshold due to the sensor output current. With this, the period where the current for judging is outputted and the period where the sensor output current is outputted are to be different, which enables accurate malfunction judgment of the sensor.

Furthermore, the malfunction detection system may be configured such that the current for judging smaller than the sensor output current is outputted all the time. In this case, it is necessary that the period where the malfunction is judged and the period where the sensor output current is outputted are different from each other. Thus, the sensor processing circuit 20 may be configured to monitor the voltage level of the terminal INA1, and performs judging immediately after the voltage level of the terminal INA1 exceeds the threshold due to the sensor output current. More specifically, signals which fall (or rise) immediately after the voltage level of the terminal INA1 exceeds the threshold due to the sensor output current may be inputted to the clock terminals of the flip-flop 332-1 and 332-2.

Furthermore, the current for judging may be outputted twice or more in the first embodiment. Here, the judging condition of the judging unit 333 is the same as described in the second embodiment, and it is judged that the sensor is malfunctioning when it is judged as NG in all periods. Alternatively, it may be judged that the sensor is malfunctioning with another judging condition that it is judged as NG in a certain number of periods. In this case, the number of times which is to be the threshold for judging sensor malfunction may be determined by the user in advance. Furthermore, the threshold according to the property of the sensor to be judged may be set in the judging unit 333.

The property of sensor refers to, for example, the frequency of the sensor malfunction and the importance of the sensor. More specifically, the higher the frequency of the sensor malfunction, the more prompt the sensor malfunction is detected by reducing the number of times used as a threshold. Furthermore, prompt detection of sensor malfunction may be achieved by reducing the number of times used as the threshold when the sensor is attached to the crucial parts and no malfunction is allowed.

In addition, in the second embodiment, the current for judging is smaller than the sensor output current outputted from the sensor. Conversely, the current for judging may be larger than the sensor output current. This allows giving priority to the malfunction detection rather than the original detection function of sensor. Therefore, prompt detection of malfunction can be achieved, for example.

Furthermore, although a resistance type sensor is used for the sensor, a thermocouple sensor or a pressure sensor may also be used.

The present invention is applicable to a case where the malfunction in the sensor causes the sensor to be high resistance. In addition, the present invention is also applicable to a case where the malfunction in the sensor causes the sensor to be low resistance. The low resistance of the sensor refers to, in an extreme case, a case where the sensor is short circuited.

In this case, the level detection unit 32 includes a comparator which outputs Hi-level when the voltage level of the terminal INA1 is equal to or less than the reference voltage Vref. In addition, including the comparator and the comparator described in the first and second embodiments in parallel enables detection of the malfunction caused by high resistance of the sensor and the low resistance of the sensor.

INDUSTRIAL APPLICABILITY

The present invention is applicable to a system for detecting malfunction in a sensor, and is applicable, for example, to a system which detects a malfunction in a sensor used for flow counter such as a water meter.

What is claimed is:

1. A malfunction detection system which detects a malfunction in a sensor, said malfunction detection system comprising:
    a sensor including a first terminal, and which outputs a sensor output current that varies a voltage level of the first terminal;
    a current outputter configured to vary the voltage level of the first terminal by outputting a current for judging to said sensor via the first terminal;
    a judger configured to judge that said sensor is malfunctioning when the current for judging causes the voltage level of the first terminal to be equal to or higher than a threshold in a period different from a first period where the sensor output current causes the voltage level of the first terminal to be equal to or higher than the threshold; and
    a period controller configured to set a second period and a third period in such a manner that at least one of the second period and the third period is different from the first period,
    wherein said current outputter is configured to output the current for judging to said sensor via the first terminal in the second period and the third period that are set by said period controller, said judger is configured to judge that the sensor is malfunctioning when the voltage level of the first terminal is equal to or higher than the threshold in both of the second period and the third period, and said period controller is configured to set a checking period for checking for the malfunction of the sensor, the checking period including the second period and the third period and being set in such a manner that a period between a starting point of the second period and a starting point of the third period is longer than the first period.

2. The malfunction detection system according to claim 1, wherein said sensor is configured to output the sensor output current which causes the voltage level of the first terminal to be equal to or higher than the threshold in the first period, and from an end point of a fourth period which is longer than the first period and starting from a starting point of the first period, and said period controller is configured to set the checking period for checking for the malfunction of the sensor, the checking period including the second period and the third period and being set in such a manner that a period between the starting point of the second period and an end point of the third period is shorter than the fourth period.

3. The malfunction detection system according to claim 1, wherein said sensor is configured to output the sensor output current which causes the voltage level of the first terminal to be equal to or higher than the threshold in the first period and to be an alternating current signal having a predetermined cycle, and said period controller is configured to set a checking period for checking for the malfunction of the sensor, the checking period including the second period and the third period and being set in such a manner that a period between the starting point of the second period and the starting point of the third period is longer than the first period, and a period between the starting point of the second period and the end point of the third period is shorter than the cycle.

4. The malfunction detection system according to claim 1, wherein said period controller is configured to set a checking period including N periods having the second period and the third period, where N is an integer equal to or more than 2, said current outputter is configured to output the current for judging to said sensor via the first terminal during the N periods that are set by said period controller, and said judger is configured to judge that the sensor is malfunctioning when the voltage level of the first terminal is equal to or higher than the threshold for M times during the N periods that are set by said period controller, where $2 \leq M \leq N$ and M is an integer.

5. The malfunction detection system according to claim 4, wherein said sensor is configured to output the sensor output current which causes the voltage level of the first terminal to be equal to or higher than the threshold in the first period, and from the end point of a fourth period which is longer than the first period and starting from the starting point of the first period, and said period controller is configured to set a checking period for checking for the malfunction of the sensor in such a manner that a period between the starting point of the second period and the starting point of the third period is longer than the first period, and a period between the starting point of the second period and the end point of the third period is shorter than the fourth period, when the second period is the first period of the checking period, and the third period is the last period of the checking period.

6. The malfunction detection system according to claim 4, wherein said sensor is configured to output the sensor output current which causes the voltage level of the first terminal to be equal to or higher than the threshold in the first period and to be an alternating current signal having a predetermined cycle, and said period controller is configured to set a checking period for checking for the malfunction of the sensor in such a manner that a period between the starting point of the second period and the starting point of the third period is longer than the first period, and a period between the starting point of the second period and the end point of the third period is shorter than the cycle, when the second period is a first period of the checking period, and the third period is a last period of the checking period.

7. The malfunction detection system according to claim 4, wherein said judger is configured to judge that the sensor is malfunctioning when the voltage level of the first terminal is equal to of higher than the threshold in all periods included in the checking period set by said period controller.

8. The malfunction detection system according to claim 4, wherein said judger is configured to detect a property of said sensor and to determine the value of M according to the detected property.

9. The malfunction detection system according to claim 1, wherein said sensor further includes a second terminal, said current outputter includes:
 a first current source connected to the first terminal; and
 a second current source connected to the second terminal, and said current outputter is configured to output the current for judging to said sensor from the first current source via the first terminal and to flow the current inputted to said sensor to the second current source via the second terminal.

10. The malfunction detection system according to claim 1, further comprising:
an internal power source generator configured to generate a power source supplied to said current outputter, using the sensor output current.

11. The malfunction detection system according to claim 1, wherein the current for judging is smaller than the sensor output current.

12. The malfunction detection system according to claim 1, wherein the current for judging is larger than the sensor output current.

13. A malfunction detection method for detecting a malfunction in a sensor, said malfunction detection method comprising:

varying a voltage level, by a current outputter, of a first terminal by outputting, via the first terminal, a current for judging to a sensor including the first terminal and which outputs a sensor output current that varies the voltage level of the first terminal;

judging, by a judger, that the sensor is malfunctioning when the current for judging causes the voltage level of the first terminal to be equal to or higher than a threshold in a period different from a first period where the sensor output current causes the voltage level of the first terminal to be equal to or higher than the threshold; and controlling periods, by a controller, to set a second period and a third period in such a manner that at least one of the second period and the third period is different from the first period, wherein said current outputter outputs the current for judging to said sensor via the first terminal in the second period and the third period that are set by said period controller, said judger judges that the sensor is malfunctioning when the voltage level of the first terminal is equal to or higher than the threshold in both of the second period and the third period, and said period controller sets a checking period for checking for the malfunction of the sensor, the checking period including the second period and the third period and being set in such a manner that a period between a starting point of the second period and a starting point of the third period is longer than the first period.

14. An integrated circuit which detects a malfunction in a sensor, said malfunction detection system comprising:

a sensor connector to which a sensor is connected, the sensor including a first terminal, and the sensor outputting a sensor output current that varies a voltage level of the first terminal;

a current outputter configured to vary the voltage level of the first terminal by outputting a current for judging to said sensor via the first terminal; and a judger configured to judge that said sensor is malfunctioning when the current for judging causes the voltage level of the first terminal to be equal to or higher than a threshold in a period different from a first period where the sensor output current causes the voltage level of the first terminal to be equal to or higher than the threshold; and a period controller configured to set a second period and a third period in such a manner that at least one of the second period and the third period is different from the first period, wherein said current output unit is configured to output the current for judging to said sensor via the first terminal in the second period and the third period that are set by said period control unit, said judger is configured to judge that the sensor is malfunctioning when the voltage level of the first terminal is equal to or higher than the threshold in both of the second period and the third period, and said period controller is configured to set a checking period for checking for the malfunction of the sensor, the checking period including the second period and the third period and being set in such a manner that a period between a starting point of the second period and a starting point of the third period is longer than the first period.

* * * * *

UNITED STATES PATENT AND TRADEMARK OFFICE
CERTIFICATE OF CORRECTION

PATENT NO. : 7,890,283 B2
APPLICATION NO. : 12/275509
DATED : February 15, 2011
INVENTOR(S) : Eiichi Sadayuki et al.

It is certified that error appears in the above-identified patent and that said Letters Patent is hereby corrected as shown below:

At column 16, line 58 (claim 13, line 5) of the printed patent, "terminal, a current" should read --terminal, current--.

Signed and Sealed this
Twelfth Day of July, 2011

David J. Kappos
*Director of the United States Patent and Trademark Office*